United States Patent [19]
Gibbs

[11] Patent Number: 5,463,648
[45] Date of Patent: Oct. 31, 1995

[54] PULSE FORMING NETWORK FOR DIODE LASER

[75] Inventor: David M. Gibbs, Apopka, Fla.

[73] Assignee: Litton Systems, Inc., Beverly Hills, Calif.

[21] Appl. No.: 283,542

[22] Filed: Aug. 1, 1994

[51] Int. Cl.⁶ ........................................ H01S 3/00
[52] U.S. Cl. ........................................ 372/38
[58] Field of Search ................................ 372/38

[56] References Cited

U.S. PATENT DOCUMENTS

| | | | |
|---|---|---|---|
| 4,292,606 | 9/1981 | Trimmel | 372/38 |
| 4,385,387 | 5/1983 | Trimmel | 372/29 |
| 4,471,494 | 9/1984 | Keil et al. | 455/611 |
| 4,995,045 | 2/1991 | Burley et al. | 372/38 |
| 5,061,957 | 10/1991 | Nishikawa et al. | 355/200 |
| 5,091,797 | 2/1992 | Proebster | 359/187 |
| 5,291,510 | 3/1994 | Gidon et al. | 372/38 |
| 5,309,458 | 5/1994 | Carl | 372/38 |
| 5,313,487 | 5/1994 | Fujikawa et al. | 372/38 |
| 5,323,408 | 6/1994 | Hahn et al. | 372/38 |
| 5,349,595 | 9/1994 | Ogawa et al. | 372/38 |

Primary Examiner—Rodney B. Bovernick
Assistant Examiner—Robert E. Wise
Attorney, Agent, or Firm—William M. Hobby, III

[57] ABSTRACT

A diode laser apparatus is heated at its junction by operating the diode at subthreshold current levels. A special bi-level pulse forming network (PFN) improves the efficiency in preheating the diode during non-operating or non-light producing modes along with the ability to supply the necessary drive during operating or light producing modes. This is accomplished by operating the laser diode at subthreshold or non-light producing current levels, which heats the diode at the diode junction directly where the heat is needed, and by the use of a bi-level pulse forming network which transfers the heating energy to the diode junction with high efficiency.

14 Claims, 2 Drawing Sheets

PULSE FORMING NETWORK FOR DIODE LASER

BACKGROUND OF THE INVENTION

The present invention relates to a laser diode preheating method and apparatus and to a system for efficiently preheating a laser diode using subthreshold current levels to preheat a diode laser junction to provide temperature stabilization in a cold operating environment and a short turn on time.

In the past it has been common to preheat laser diodes which require fast turn on and which need to be brought to a rapid temperature stabilization. The solution is to provide various types of heating elements which can be turned on under various circumstances to heat the laser diode or a bank of laser diodes. These techniques work well in most conditions but have proved unsatisfactory in situations where the laser diodes are operated by batteries, especially in colder environments since the batteries have limited amounts of stored power which must operate the laser diode. Electrical heating can use up the power rapidly, resulting in a shorter life for battery operated diodes.

The temperature stabilization is required to maintain desired output wavelength when the laser diodes are operated in their normal superthreshold (light producing) mode. The high efficiency is desired when using finite energy power sources, such as batteries. Use of conventional heater strips or other resistive elements generally place the heating medium relatively far from the diode junctions and add mechanical complexity to the system. The present apparatus and method provides for heating the diode junction directly, where it is needed, with current flow through the junction. Discounting power source efficiency, the heating efficiency is on the order of 98% to 99%.

SUMMARY OF THE INVENTION

A diode laser apparatus is heated at its junction by operating the diode at subthreshold current levels. A special bi-level pulse forming network (PFN) improves the efficiency in preheating the diode. This is accomplished by operating the laser diode at subthreshold or non-light producing current levels, which heats the diode at the diode junction directly where the heat is needed with the use of a bi-level pulse forming network, which transfers the heating energy to the diode junction with efficiency approaching 100%.

The apparatus includes a laser diode having a two level power supply coupled to the laser diode for operating the laser diode at superthreshold in one mode of operation and at a subthreshold in a second mode of operation and includes a pulse forming network for generating current pulses in the laser diode. The pulse forming network is coupled to the two level power supply and to the laser diode for actuating the laser diode in a subthreshold mode of operation for heating the diode junction without producing light and in a superthreshold mode of operation for producing light, so that the laser diode has improved temperature stabilization and shortened turn on time by switching from a subthreshold mode to a super threshold mode.

The method of heating a laser diode junction includes the steps of selecting a two level laser diode power supply for operating a laser diode in superthreshold mode in one output level of said power supply and in a subthreshold mode in a second output level of said power supply and selecting a pulse forming network to actuate the two level power supply for driving a laser diode in a subthreshold mode for heating the diode junction without producing light and in a superthreshold mode for producing light from the laser diode and coupling the selected two level laser diode power supply to a laser diode and the selected pulse forming network to the selected two level laser diode power supply and to said laser diode so that the laser diode is selectively operated in one of two modes to either heat a laser diode junction or to produce light from said laser diode.

BRIEF DESCRIPTION OF THE DRAWINGS

Other objects, features and advantages of the present invention will be apparent from the written description and the drawings in which.

DESCRIPTION OF THE PREFERRED EMBODIMENTS

Figure 1:
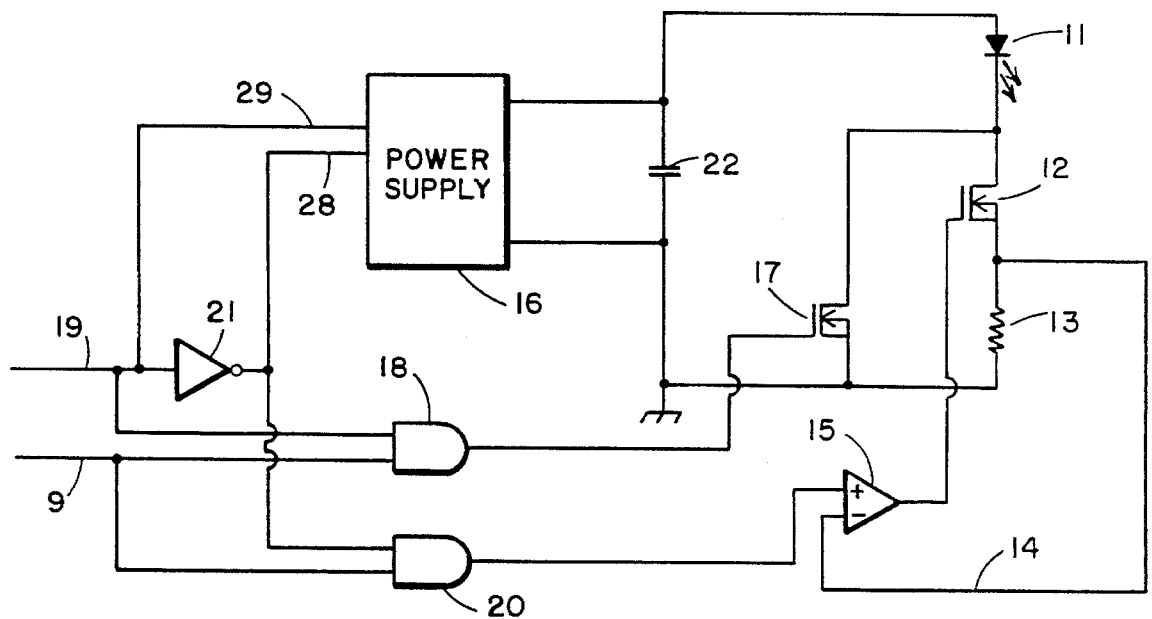
FIG. 1 is a schematic of a laser diode and pulse forming network in accordance with the present invention.

A special pulse forming network (PFN) as seen in FIG. 1 is used for heating the arrays or bars of laser diodes used in pumping solid state lasers such as a Nd:YAG laser. The special PFN incorporates laser diode 11 SUB-THRESHOLD operation which induces self-heating of the diode 11 without electrical to optical conversion of power. Electrical energy into the diodes 11 during SUB-THRESHOLD operation is entirely converted to heat without any electrical to optical power conversion. The purpose of this is to quickly warm the diodes up to operating temperature from low ambient temperature conditions to meet fast turn on requirements. The output wavelength of laser diode 11 is very temperature dependent and requires a stable operating environment to maintain output wavelength and therefore be able to properly "pump" the gain medium (such as Nd:YAG).

Many pulse forming network's are in use for generating the necessary current pulse generally a square wave of fixed amplitude for a finite period of time through laser diodes. The present PFN uses a current regulator with a power field effect transistor or FET 12 (or MOSFET) which adjusts the level of laser diode 11 current automatically. It is accomplished with a current sensing device 13, such as a resistor, whose output is fed back through a conductor 14 to an error amplifier 15 which adjusts the FET 12 gate voltage. This adjustment automatically maintains the desired laser diode 11 current level corresponding to the reference level input. Other methods, such as fixed value, lumped parameter, L-C (inductance, capacitance) networks do not allow flexible reference level input adjustment. Also, because of relatively high currents involved, these networks need larger volume of space for the inductors used to form the pulse shape in conjunction with the capacitors.

Excess electrical losses are typical in a FET regulated diode pumping PFN when running at sub-threshold. This is due to the necessary higher voltage drop across the PFN network's current regulating FET. Using a special two level power supply 16 and a Non-regulated FET switch 17, which is added to the PFN allows two modes of operation. One mode is a heatup mode and the other a normal firing mode. FIG. 1 shows a potential solution which allows the sub-threshold operation of the diode 11 for heating purposes without excessive PFN losses. Subthreshold operation occurs when the HEAT MODE signal goes on high.

FIG. 1 shows an extra FET switch 17, additional logic gates 18 & 20 connected to the PFN pulse line 9, and a two output level power supply 16 for SUB-THRESHOLD operation. This is in addition to the typical single FET 12 regulator, current sensing resistor 13 and error amplifier 15 and inverting gate 21. The gate 21 has an input heat mode line 19 which is also connected to the low input 29 of the power supply 16. The output line 28 from the gate 21 is connected to the high input of the power supply 16.

Like all electrical devices, laser diodes have a voltage drop thereacross when current flows therethrough and the relationship is predictable for a given diode array. For instance, a diode pumped cavity box may have 16 arrays of diodes with five bars per array. If connected in series, which they usually are, the voltage drop across the diodes are as shown below for two cases:

CASE 1: SUPER-THRESHOLD operation 192 volts (16 arrays * 5 bars/array * 2.4 volts/bar) @ 80 amps for 200 μS. This is 15.3 kilowatts instantaneous power for 200 μS yielding a 3 Joule pump. 40% of this electrical energy input (1.2 Joules) is converted to optical (non-heating) power and the balance (1.8 Joules) is actually available for heating.

CASE 2: SUB-THRESHOLD operation 144 volts (16 arrays×5 bars/array×1.8 volts/bar) @ 20 amps for 200 μS. This is 2.88 kilowatts of instantaneous power and results in a 0.576 Joule pump. The amount of heating is the total 0.576 Joules of pump during SUB-THRESHOLD operation.

Normal pulse forming network losses result as follows. To maintain SUPER-THRESHOLD operation during the normal firing of the diodes requires a trade-off between power supply size, capacitor 22 size, and PFN losses.

1) In the extreme sense, if a power supply that could handle and supply the 15 kilowatt instantaneous power could be packaged and just switched on for the "firing" of the diodes, then capacitors and PFN losses would not need to be considered. This is size and cost prohibitive.

2) The next option is to use a power supply that can handle the average power needed by the system and by storing energy in a capacitor between the "firings" to be quickly drawn upon for the instantaneous peak power needed. Using an assumed 20 Hz repetition rate and a typical pulse width of 200, the average power required would be as follows: Instantaneous Power times the Duty Cycle $P_{inst}$ * D.C.= 15.3 KW * 200 μS/50 mS=61 Watts.

3) Option 2 is the viable approach, but is not absent tradeoff considerations. To maintain the 80 amp SUPER-THRESHOLD current level, either of the following must be adhered to:

a) Make the capacitor 22 infinitely large (in the extreme sense) to prevent any capacitor voltage droop during the discharge cycle and use the PFN switch 12 (FET) as a pure switching device (negligible ON resistance) to apply the capacitor 22 voltage to the diode 11. The capacitor 22 will then have negligible droop during discharge and therefore will result in a fixed current through the diodes. However, infinitely large capacitors are not practical and would be expensive.

b) Allow the droop to occur using smaller capacitors by charging the capacitors to a higher level than the minimum required voltage for superthreshold operation. This amount of droop is inversely proportional to capacitor size. Therefore, using a smaller capacitor 22 requires a higher voltage be applied to them allowing for the expected droop. In this situation, the PFN switch 12 (FET) now becomes a regulator that has to hold back applied voltage on the capacitor 22 during the initial portion of the discharge period. This has to be done to maintain constant current through the diode 11. During this time, the FET 12 has a voltage across it and current through it, thereby dissipating power. This wasted power can be a significant fraction of the supplied power during SUB-THRESHOLD operation.

Thus, you cannot use a 15 KW power supply to eliminate the PFN switch 12 and capacitor 22 altogether without paying significant weight/volume/price penalty for the power supply. Use of an infinitely large capacitor to eliminate droop, and therefore PFN electrical losses, is not practical, due to the weight/volume/price penalty. You need to balance capacitor size against droop or PFN electrical losses.

SUB-THRESHOLD operation allows all diode 11 input energy to be converted to heat. However, without any special allowance to avoid PFN current regulator 12 (FET) losses, the overall heating efficiency suffers significantly and this is the purpose of the present invention.

As shown in FIG. 1, the power supply 16 has two output settings that are programmed by logic gate 21. The two FET's 12 and 17 are used separately from one another. The FET (either 12 or 17) in use depends on mode of operation and is chosen by the state of the heat mode signal and the resultant output of the logic gates 18 and 20. The FET 12 connected to the error amplifier 15 is the regulator for limiting the current during "normal" SUPER-THRESHOLD firings. It will have a voltage drop across it during the 80 amp discharge cycle and will dissipate energy (PFN loss). Again, this necessity is due to droop allowance with non-infinitely large capacitors 22.

Figure 2:
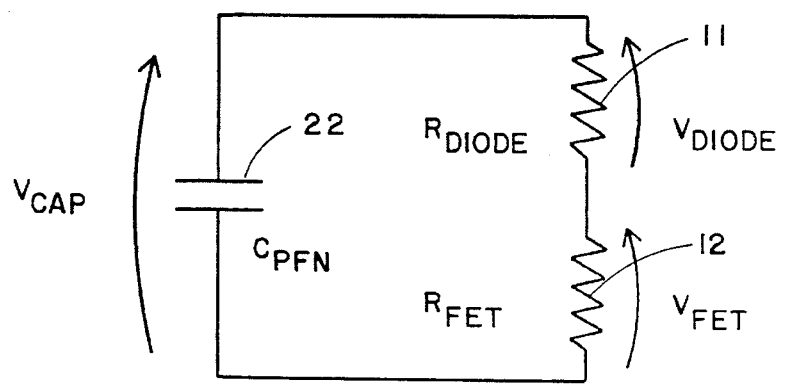
FIG. 2 is a model diagram of the operation of a pulse forming network circuit for calculating pulse width and rep rate.

In the heat mode, the regulator FET 12 is disabled and the power supply 16 is set to low level (SUB-THRESHOLD voltage droop). Now the other FET 17 (HEAT MODE) is turned completely on for heatup when required. FIG. 2 shows the effective circuit and the corresponding voltage and currents in the laser diode 11 during this mode of operation. The FET "ON" resistance is modeled as a simple resistor (typically 0.05 to 0.1 ohm). The diode equivalent "ON" resistance can be modeled by the relationship:

$$R_{diode} = \left( \frac{V_{diode}}{I_{diode}} \right) @ \text{SUB-THRESHOLD} \quad (1)$$

Because the capacitors 22 are not infinitely large, droop will occur in the SUB-THRESHOLD operation during each heat pulse. Care must be taken to optimize heating time by providing the following during the HEAT MODE:

1) Minimize the "ON" time for each heat pulse to minimize drooping.

2) Maximize heat pulse repetition rate.

3) "ON" time and rep rate are set for the proper duty cycle such that it does not exceed the rating of the diodes but still yields sufficient heating.

Calculating heating power for each pulse and subsequently determine the desired pulse width and rep rate for maximum heating capability involves using the models for the FET and diodes in FIG. 2. Using (1) for calculating diode resistance during SUB-THRESHOLD operation yields 7.2 ohms. A typical FET will have an "ON" resistance of 0.1 ohm, worst case. The instantaneous diode heating power is calculated by the following:

$$p_{diode}(t) = (v_{diode}(t) \cdot i_{diode}(t)) \quad \quad 5$$

A typical circuit of FIG. 1 can include the following components:

A laser diode array 11 configured from diodes such as the Spectra Diode Labs SDL-3200 series laser diodes and N-channel enhancement MOSFET 12 and 17 with low on resistance and high current capability such as OMNIREL part number OM6025SC.

Resistor 13 can be a 0.15 Ω, 1% tolerance, 1 watt power handling capability such as (industry standard part number) RWR81SR150FS.

The operational amplifier 15 can have high input impedance, low output impedance, high current drive and slewing capability such as National Semiconductor LH0002.

The power supply 16 can be either programmable output level capability or two separate power supplies whose buffered outputs are gated to the capacitor 22 based on the output state of inverting gate 21.

2-input TTL "and" gates 18 and 20 can be used such as (industry standard part number) 74xx08 where xx can be LS or HC and TTL "invertor" gate 21 can be (industry standard part number) 74xx04 where xx can be LS or HC.

Capacitor 22 can be 800–900 μF (microfarad), 20% tolerance, 200 V rating with low equivalent series resistance (ESR) such as three (3) parallel connected Marcon part number CEAUF2D271M10 capacitors.

Referring to FIG. 2, the voltage across the diode 11 is a fraction of the capacitor 22 voltage using the voltage divider rule and the current through the diode 11 is identical to the capacitor 22 current. Therefore the following is equivalent:

$$p_{diode}(t) = \alpha \cdot v_{cap}(t) \cdot i_{cap}(t) \text{ where } \alpha = \frac{R_{diode}}{R_{diode} + R_{FET}} \quad (2)$$

The exponential decay is easily found in any textbook for a simple RC network and the description for the voltage and current verses time for these quantities is as follows:

$$v_{cap}(t) = v_{cap_{initial}} \cdot e^{-\left(\frac{t}{(R_{diode} + R_{FET}) \cdot C}\right)} \text{ and}$$

$$i_{cap}(t) = I_{cap_{initial}} \cdot e^{-\left(\frac{t}{(R_{diode} + R_{FET}) \cdot C}\right)}$$

Letting the following relations substitute for the above quantities:

$$\tau = (R_{diode} + R_{FET}) \cdot C, \; V_{cap_{initial}} = V_{ci}, \text{ and } I_{cap_{initial}} = V_{ci}$$

and inserting into (2) thereby yields:

$$p_{diode}(t) = \alpha \cdot V_{ci} \cdot I_{ci} \cdot e^{-\left(\frac{2t}{\tau}\right)}$$

The average power during this decay process will be determined with the following equation:

$$P_{diode_{ave}} = \frac{\int_0^t p_{diode}(t) \cdot dt}{\int_0^t dt}$$

Using the expression for instantaneous power in the diodes with the upper limit in the integration process as the FET "ON" time, Γ, the following results:

$$P_{diode_{ave}} = \frac{\alpha \cdot V_{ci} \cdot I_{ci} \int_0^\Gamma e^{-\left(\frac{2t}{\tau}\right)} \cdot dt}{\int_0^\Gamma dt}$$

The evaluation of this equation leads to the following:

$$P_{diode_{ave}} = \left( \frac{\alpha \cdot V_{ci} \cdot I_{ci} \cdot \tau}{2\Gamma} \right) (1 - e^{-\left(\frac{2\Gamma}{\tau}\right)})$$

Figure 3:
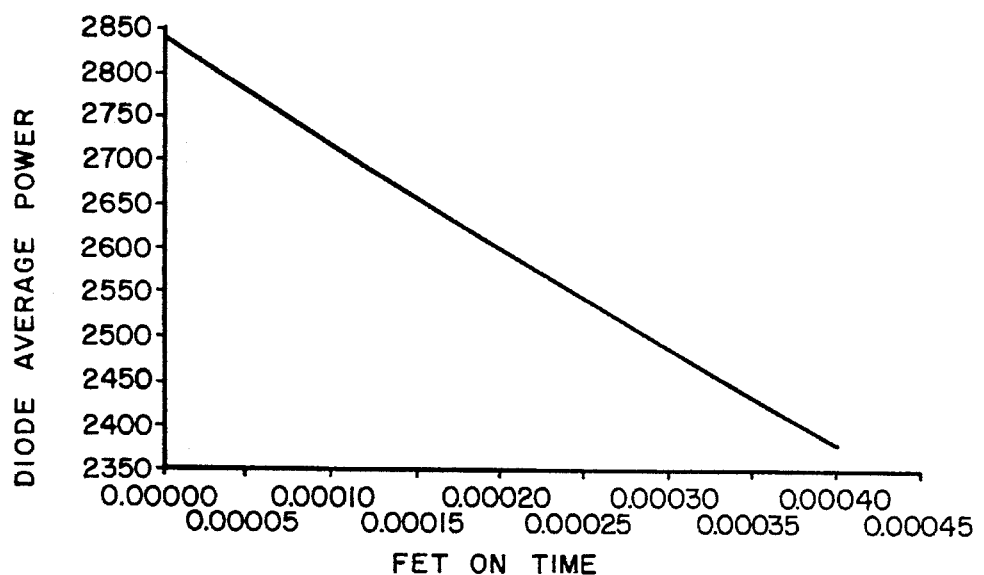
FIG. 3 is a chart of the average diode power versus FET ON time.

A graph of this formula using the following parameters yields the FIGS. 3 plot of average diode power verses FET ON time.

For extremely small values of FET ON time, the average power approaches that of the capacitor 22 supply voltage times the diode current times the voltage divider ratio as one would suspect. This is due to the essentially zero droop encountered for short capacitor 22 discharge times. The initial capacitor 22 voltage $V_{ci}$ is 144 volts and initial diode current $I_{ci}$ is 20 amps for diode sub-threshold operation, and the voltage divider ratio is (7.2/7.3). This yields a maximum average power per pulse of 2841 watts.

Because each current pulse droops during SUB-THRESHOLD operation, the best form to heat the diode 11 is with short duration pulses but at higher repetition rates. As long as safe duty cycle factors are adhered to, this yields a good alternative to resistive heating methods by using diode self heating without significant PFN losses.

As shown, the heatup of the diodes is best accomplished during SUB-THRESHOLD operation by using a separate FET switch (fully ON) and a dual output power supply (LOW LEVEL for SUB-THRESHOLD) to gain better heating efficiency by minimizing PFN losses. Overall heating efficiency from the power source assuming power supply efficiency of 80% is 79% efficient. This is primarily due to 100% conversion efficiency in the SUB-THRESHOLD operation of the diodes and the now ultra-low losses (98.6% efficiency) in the PFN. The primary limiting efficiency is now the power supply at 80%.

Figure 4:
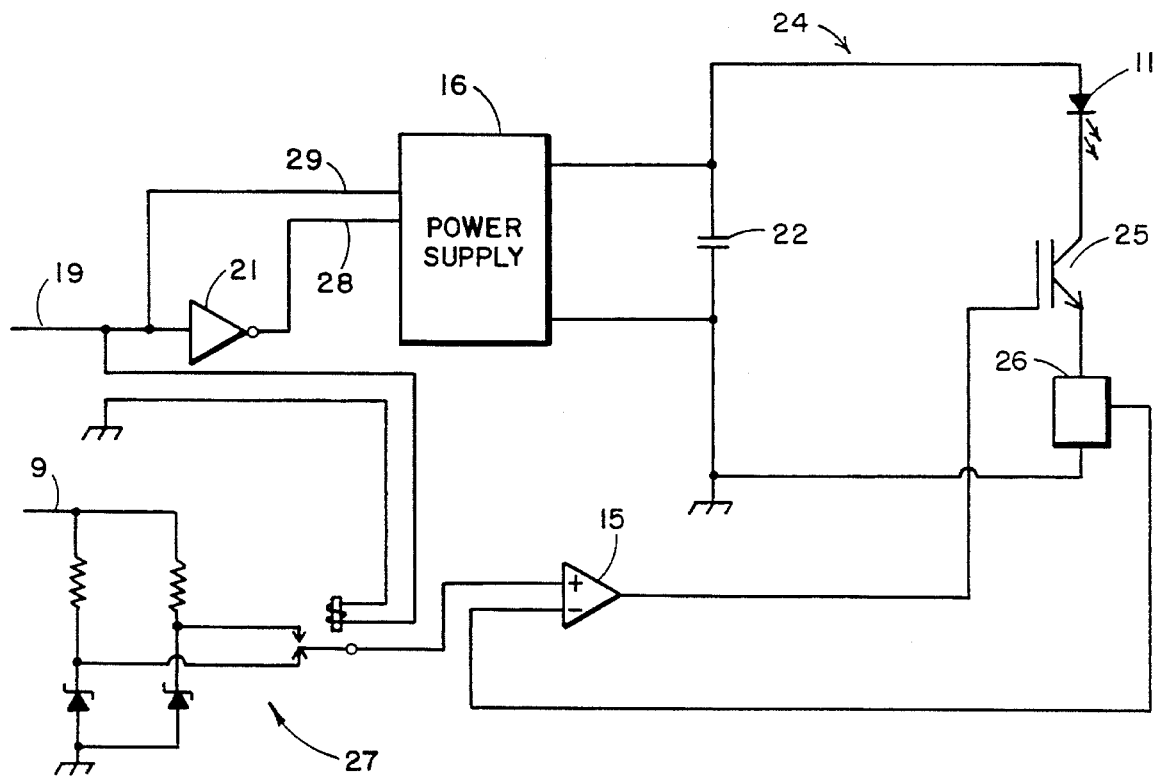
FIG. 4 is a schematic diagram of an alternate embodiment of a of a laser diode and pulse forming network in accordance with the present invention.

Another PFN 24 implementation is shown in FIG. 4. It has a single regulator, insulated gate bipolar transistor (IGBT) 25, for both the normal and heat mode. This transistor 25 has an even lower full on resistance at around 0.03 ohms compared to a FET with 0.05 ohms at their typical lowest resistance. The current sensor 26 is essentially a lossless device in either mode using Hall Effect techniques. The level of driving is determined by a switchable gate drive 27, using a pair of zener diodes and a relay, for the error amplifier 15. This diagram simplifies the drive network and uses less active devices.

I claim:

1. A laser diode apparatus comprising:

a laser diode;

a two level power supply having a heat mode signal input and being coupled to said laser diode for operating said laser diode at superthreshold in one level of operation and at a subthreshold in a second level of operation responsive to heat mode signals applied to said heat mode signal input; and a pulse forming network for generating current pulses in said laser diode, said pulse forming network being coupled to said two level power supply and to said laser diode for actuating said laser diode in a subthreshold mode of operation for heating said diode junction without producing light and in a superthreshold mode of operation for producing light, whereby a laser diode has improved temperature stabilization and shortened turn on time by switching from a subthreshold mode to a super threshold mode.

2. A laser diode apparatus in accordance with claim 1 in which said pulse forming network includes a current regulating FET which is enabled for adjusting the laser diode current level in superthreshold mode.

3. A laser diode apparatus in accordance with claim 2 in which said pulse forming network current regulating FET is coupled through an error amplifier for adjusting the FET gate voltage for adjusting the laser diode current level in superthreshold mode, said error amplifier having a feedback signal from a current sensor.

4. A laser diode apparatus in accordance with claim 2 in which said pulse forming network includes a predetermined capacitance connected across said laser diode and in series with said current regulating FET.

5. A laser diode apparatus in accordance with claim 1 in which said pulse forming network has a plurality of logic gates for switching between subthreshold and super threshold modes of operation.

6. A laser diode apparatus in accordance with claim 1 in which said pulse forming network includes a non current regulating FET which is enabled to drive said laser diode in a subthreshold mode.

7. A laser diode apparatus in accordance with claim 6 in which said pulse forming network operates in a heat mode by said regulating FET being disabled and the power supply set to a low level and a said non current regulating FET being enabled for heatup.

8. A laser diode apparatus in accordance with claim 1 in which said pulse forming network includes an insulated gate bipolar transistor to switch between said superthreshold mode and sub-threshold mode.

9. A method of heating a laser diode junction comprising the steps of:

selecting a two level laser diode power supply having a heat mode signal input for operating a laser diode in superthreshold mode in one level of said power supply and in a subthreshold mode in a second level said power supply responsive to heat mode signals applied to said heat mode signal input;

selecting a pulse forming network to actuate said two level power supply for driving a laser diode in a subthreshold mode for heating said diode junction without producing light and in a superthreshold mode for producing light from said laser diode; and coupling said selected two level laser diode power supply to a laser diode and said selected pulse forming network to said selected two level laser diode power supply and to said laser diode whereby a laser diode is selectively operated in one of modes to either heat a laser diode junction or to produce light from said laser diode.

10. A method of heating a laser diode junction in accordance with claim 9 in which the step of selecting a pulse forming network includes selecting a pulse forming network having a regulated FET which is enabled for adjusting the laser diode current level in superthreshold mode.

11. A method of heating a laser diode junction in accordance with claim 10 in which the step of selecting a pulse forming network includes selecting a pulse forming network having a plurality of logic gates for selecting one of said two level power supply's two output settings.

12. A method of heating a laser diode junction in accordance with claim 11 in which the step of selecting pulse forming network includes selecting a pulse forming network having a non-current regulating FET which is enabled to drive said laser diode in a subthreshold mode.

13. A method of heating a laser diode junction in accordance with claim 12 in which the step of selecting a pulse forming network includes selecting a pulse forming network which can selectively disable said current regulating FET while enabling said non-current regulating FET in a heat mode.

14. A method of heating a laser diode junction in accordance with claim 9 in which the step of selecting a pulse forming network includes selecting a pulse forming network having an insulated gate bipolar transistor to operate said laser diode in either superthreshold operation or sub-threshold operation.

* * * * *